US006580290B1

(12) United States Patent
Robinson

(10) Patent No.: US 6,580,290 B1
(45) Date of Patent: Jun. 17, 2003

(54) OPEN COLLECTOR/DRAIN AND SSTL COMPLIANT OUTPUT DRIVER CIRCUIT AND METHOD FOR OPERATING THE CIRCUIT

(75) Inventor: Michael A. Robinson, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/055,087

(22) Filed: Jan. 22, 2002

(51) Int. Cl.[7] ........................................ H03K 19/0175

(52) U.S. Cl. ........................ 326/57; 326/56; 326/58; 326/30

(58) Field of Search ..................... 326/26, 27, 30–34, 326/56–58

(56) References Cited

U.S. PATENT DOCUMENTS 4,481,432 A 11/1984 Davies, Jr.
5,166,558 A * 11/1992 Ohsawa .................... 307/475
5,497,113 A * 3/1996 Uber ........................ 327/170
5,666,069 A * 9/1997 Gibbs ........................ 326/81
6,208,168 B1 3/2001 Rhee

* cited by examiner

*Primary Examiner*—Michael Tokar
*Assistant Examiner*—Anh Q. Tran

(57) ABSTRACT

An output driver circuit that is compliant to both open collector/drain and stub series-terminated logic (SSTL) specifications and a method of operating the output driver circuit utilize a feedback loop to monitor the voltage on the output terminal of the output driver circuit to selectively deactivate either a pull-up or pull-down device. The use of the feedback loop allows the output driver circuit to float the output terminal when the voltage on the output terminal has exceeded or fallen below a threshold voltage. Consequently, the output driver circuit can provide output signals that are compatible to SSTL specifications by selectively activating one of the pull-up and pull-down devices, or signals that are compatible open collector/drain specifications by selectively deactivating both pull-up and pull-down devices to float the output terminal.

15 Claims, 4 Drawing Sheets

$V_{CC}$ 300 326 316 334 332 328 324 302 336 REF 320 306 308 322 318 314 312 338 330 304 310

OPEN COLLECTOR/DRAIN AND SSTL COMPLIANT OUTPUT DRIVER CIRCUIT AND METHOD FOR OPERATING THE CIRCUIT

FIELD OF THE INVENTION

The invention relates generally to integrated circuit devices, and more particularly to an output driver circuit of an integrated circuit device for high speed communication.

BACKGROUND OF THE INVENTION

Integrated circuit (IC) devices for high speed communication, such as fiber optics networking IC devices and other networking IC devices, include output driver circuits to drive downstream external devices using logic signals. However, the input circuits of these downstream external devices may be designed with different specifications. As an example, some input circuits may be designed to be compatible to open collector/drain specifications, while other input circuits may be designed to be compatible to stub series-terminated logic (SSTL) specifications. Consequently, there are different designs of output driver circuits so that the output driver circuits can properly function with the particular input circuits of the downstream external devices.

In FIG. 1, a simple exemplary output driver circuit 100 that is compliant to open collector/drain specifications is shown. The output driver circuit includes a pull down device 102, which in this example is a metal oxide semiconductor (MOS) transistor. However, the pull-down device can be a different active device, such as a bipolar transistor. The pull-down MOS transistor is connected between an output terminal 104 and ground. The gate of the pull-down MOS transistor is connected to an input terminal 106 to receive high and low input signals, which represent logical signals of 1's" and 0's. When a high input signal (i.e., a logical signal of 1) is applied to the input terminal, the pull-down MOS transistor is activated, and thus, the output terminal is grounded. In contrast, when a low input signal (i.e., a logical signal of 0) is applied to the input terminal, the pull-down MOS transistor is deactivated, and thus, the output terminal is floated.

These two conditions on the output terminal 104 of the output driver circuit 100 to provide high and low states on the input terminal of a downstream external device (not shown). When the output terminal of the output driver circuit is grounded, the voltage on the input terminal of the downstream external device is pulled down to produce a low signal (i.e., a logical signal of 0). Thus, when a high input signal is applied to the input terminal 106 of the output driver, a low signal is produced on the input terminal of the downstream external device. However, when the output terminal of the output driver circuit is floated, the voltage on the input terminal of the downstream external device is pulled up using a resistor connected to a voltage source of the external device to produce a high signal (i.e., a logical signal of 1). Thus, when a low input signal is applied to the input terminal of the output driver, a high signal is produced on the input terminal of the downstream external device.

In FIG. 2, a simple exemplary output driver circuit 200 that is compliant to SSTL specifications is shown. The output driver circuit includes a pull-down device 202 and a pull-up device 204. In this example, the pull-down device is an N-channel MOS transistor and the pull-up device is a P-channel MOS transistor. However, similar to the output driver circuit 100 of FIG. 1, other types of active devices may be used for the pull-down and pull-up devices. The PMOS transistor is connected between a supply voltage source $V_{cc}$ and an output terminal 206, while the NMOS transistor is connected between the output terminal and ground. The gates of the MOS transistors are connected to an input terminal 208 to receive high and low input signals, which again represent logical signals of 1's" and 0's. When a high input signal (i.e., a logical signal of 1) is applied to the input terminal 208, only the pull-down NMOS transistor is activated, and thus, the voltage on the output terminal 206 is pulled low to provide a low output signal. In contrast, when a low input signal (i.e., a logical signal of 0) is applied to the input terminal, only the pull-up PMOS transistor is activated, and thus, the voltage on the output terminal is pulled up to provide a high output signal. Thus, the output driver circuit 200 provides inverted low and high output signals in response to high and low input signals.

The compatibility of an output driver circuit of an IC device with the input circuit of a downstream external device depends on the specifications of both circuits. However, the specification of the input circuit is often unknown to the designer of the IC device. Thus, different designs of the output driver circuit need to be constructed to ensure that the IC device will be compatible to various input circuits of the downstream external devices. Otherwise, the IC device may not work with a particular input circuit of the downstream external device.

In view of this concern, there is a need for an output driver circuit that is compliant with both open collector/drain and SSTL specifications and a method for operating the output driver circuit.

SUMMARY OF THE INVENTION

An output driver circuit that is compliant to both open collector/drain and stub series-terminated logic (SSTL) specifications and a method of operating the output driver circuit utilize a feedback loop to monitor the voltage on the output terminal of the output driver circuit to selectively deactivate either a pull-up or pull-down device. The use of the feedback loop allows the output driver circuit to float the output terminal when the voltage on the output terminal has exceeded or fallen below a threshold voltage. Consequently, the output driver circuit can provide output signals that are compatible to SSTL specifications by selectively activating one of the pull-up and pull-down devices, or signals that are compatible open collector/drain specifications by selectively deactivating both pull-up and pull-down devices to float the output terminal.

An output driver circuit in accordance with the present invention includes a pull-up device, a pull-down device and a feedback loop. The pull-up device is connected between a high voltage terminal and an output node, while the pull-down device is connected between the output node and a low voltage terminal. The pull-up and pull-down devices are configured to produce an output signal on the output node in response to an input signal. The pull-up and pull-down devices may be metal oxide semiconductor (MOS) transistors, bipolar junction transistors (BJTs), high electron mobility transistors (HEMTs), or any other active devices. The feedback loop is connected to the output node and either the pull-up or pull-down device. The feedback loop is configured to deactivate the pull-up or pull-down device when the voltage of the output signal on the output node has satisfied a predefined criterion.

In a first embodiment, the feedback loop is connected to the pull-up device to selectively deactivate the pull-up device when the voltage of the output signal on the output node has exceeded a threshold voltage. In this embodiment, the pull-down device may be connected to an input terminal of the output driver circuit such that the pull-down device is controlled by the input signal.

In the first embodiment, the feedback loop may include a differential amplifier and a pass gate. One of the inputs of the differential amplifier is connected to the output node to receive the output signal, while the other input of the differential amplifier is configured to receive a reference voltage. The output of the differential amplifier is a signal that is proportional to the voltage difference between the output signal and the reference voltage. The pass gate is connected to the output of the differential amplifier and the pull-up device. The pass gate is configured to transmit the signal from the differential amplifier to the pull-up device when the pass gate is enabled. The pass gate may be configured to be enabled when the input signal is a particular type of signal.

In a second embodiment, the feedback loop is connected to the pull-down device to selectively deactivate the pull-down device when the voltage of the output signal on the output node has fallen below a threshold voltage. In this embodiment, the pull-up device may be connected to the input terminal of the output driver circuit such that the pull-up device is controlled by the input signal.

In either embodiment, the feedback loop may include a differential amplifier and a pass gate. The differential amplifier has two inputs and an output. One of the inputs of the differential amplifier is connected to the output node to receive the output signal, while the other input of the differential amplifier is configured to receive a reference voltage. The output of the differential amplifier is a signal that is proportional to the voltage difference between the output signal and the reference voltage. The pass gate is connected to the output of the differential amplifier and the pull-up or pull-down device. The pass gate is configured to transmit the signal from the differential amplifier to the pull-up or pull-down device when the pass gate is enabled. The pass gate may be configured to be enabled when the input signal is a particular type of signal.

A method of operating an open collector/drain and SSTL compliant output driver circuit in accordance with the invention includes the steps of activating one of the pull-up and pull-down devices of the output driver circuit to generate an output signal on an output node in response to an input signal, and selectively deactivating the activated device to float the output node when the voltage of the output signal on the output node has satisfied a predefined criterion.

The step of deactivating the activated device may include monitoring the voltage difference between the output signal on the output node and a reference voltage. In some embodiments, the step of deactivating the activated device includes deactivating the pull-up device when the voltage of the output signal on the output node has exceeded a threshold voltage, which is determined by the reference voltage. In other embodiments, the step of deactivating the activated device includes deactivating the pull-down device when the voltage of the output signal on the output node has fallen below the threshold voltage.

In an embodiment, the step of deactivating the activated device includes enabling a feedback loop based on the input signal and the voltage of the output signal. The feedback loop is connected to either the pull-up device or the pull-down device.

Other aspects and advantages of the present invention will become apparent from the following detailed description, taken in conjunction with the accompanying drawings, illustrated by way of example of the principles of the invention.

DETAILED DESCRIPTION

Figure 1:
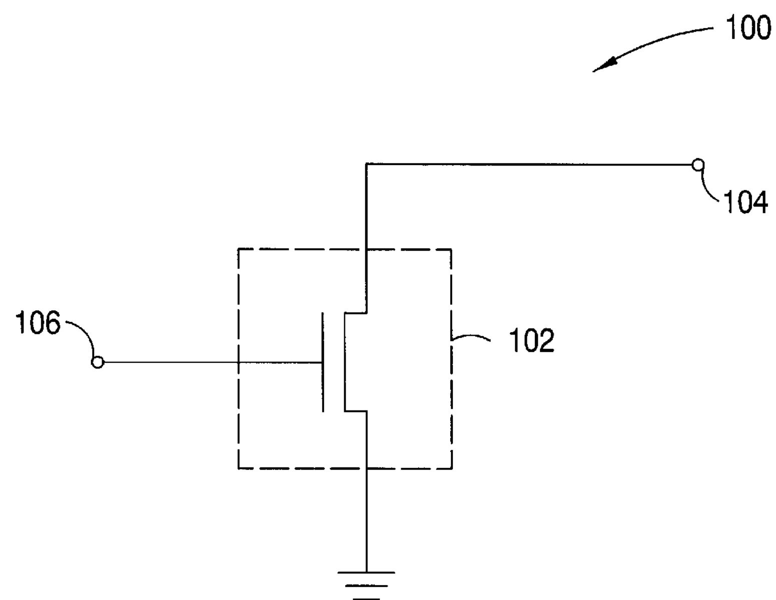
FIG. 1 is a schematic of a simple exemplary output driver circuit that is compliant to open collector/drain specifications.
Figure 2:
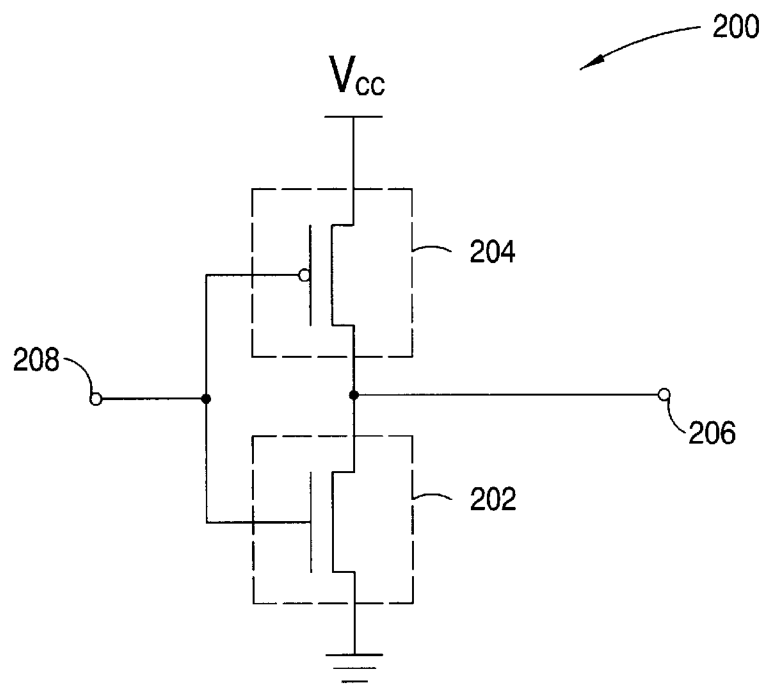
FIG. 2 is a schematic of a simple exemplary output driver circuit that is compliant to stub series-terminated logic (SSTL) specifications.
Figure 3:
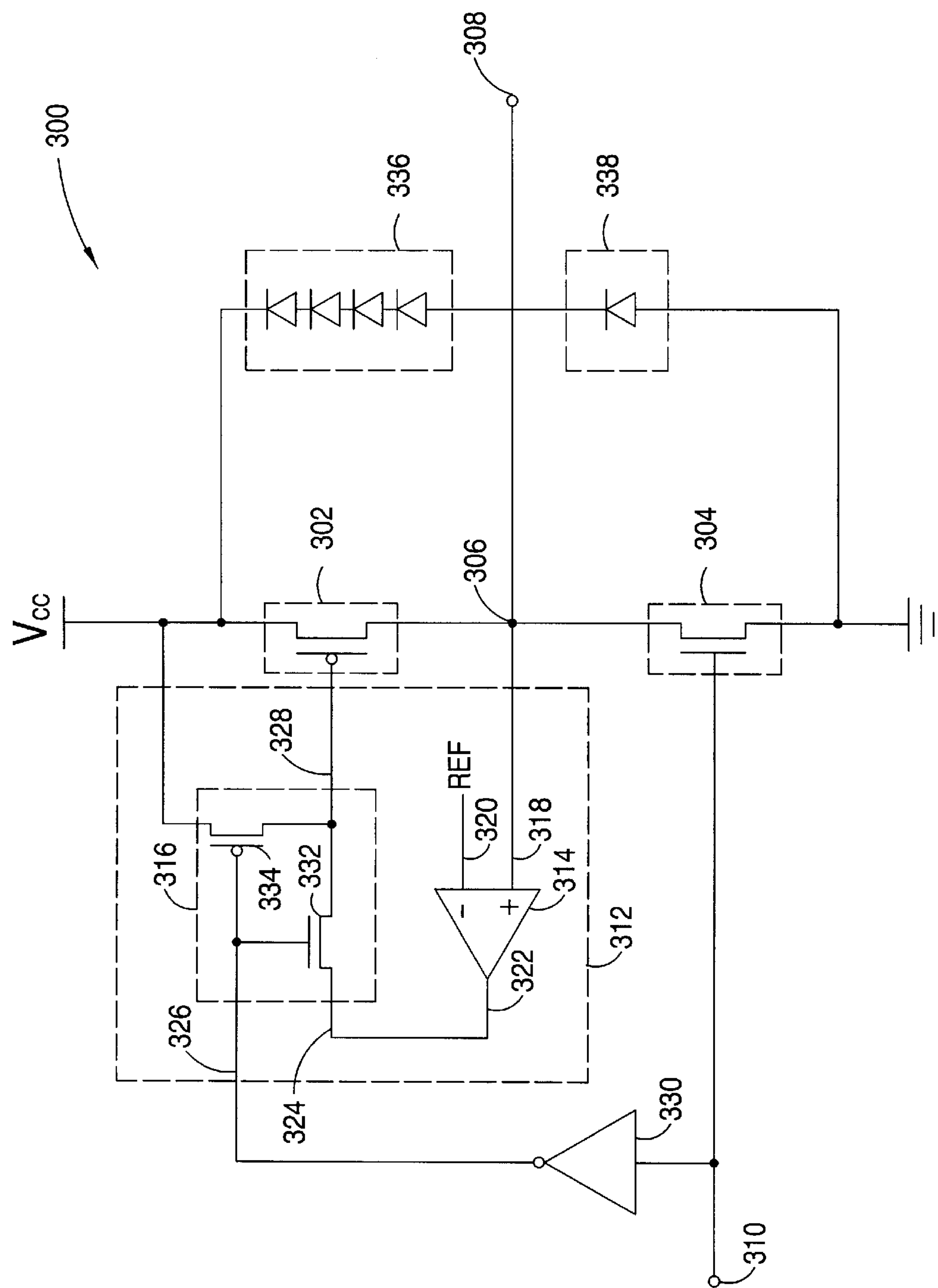
FIG. 3 is a schematic of an output driver circuit in accordance with a first embodiment of the present invention.

With reference to FIG. 3, an output driver circuit 300 in accordance with a first embodiment of the invention is shown. The output driver circuit is designed to be compliant with both open collector/drain and stub series-terminated logic (SSTL) specifications. Thus, the output driver circuit can be used with downstream external devices having an input circuit that meets either open collector/drain or SSTL specification. Consequently, the output driver circuit can be used in more applications than conventional output driver circuits that are designed to be compliant with only one of open collector/drain and SSTL specifications.

The output driver circuit 300 includes a pull-up device 302 and a pull-down device 304 that are connected in series between the supply voltage ($V_{cc}$) and ground. The pull-up and pull-down devices can be any type of active device, such as metal oxide semiconductor (MOS) transistors, bipolar junction transistors (BJTs) and high electron mobility transistors (HEMTs). However, the pull-up and pull-down devices are described and illustrated herein as P-channel MOS transistor and N-channel MOS transistor, respectively. The pull-up PMOS transistor 302 is connected between Vcc and an output node 306, while the pull-down NMOS transistor is connected between the output node and ground. The output node is connected to an output terminal 308 of the output driver circuit. The pull-down NMOS transistor is controlled by an input signal on an input terminal 310 of the output driver circuit. The pull-up PMOS transistor is controlled by a signal on a feedback loop 312.

The feedback loop 312 of the output driver circuit 300 is connected to the output node 306 and the pull-up PMOS transistor 302. The feedback loop includes a differential amplifier 314 and a pass gate 316. The differential amplifier includes two inputs 318 and 320 and an output 322. Similarly, the pass gate includes two inputs 324 and 326 and an output 328. The input 318 of the differential amplifier is connected to the output node, while the input 320 of the differential amplifier is connected to a reference voltage. The output 322 of the differential amplifier is connected to the input 324 of the pass gate. The other input 326 of the pass gate is connected to the input terminal 310 through an inverter 330. Thus, the signals received on the input 326 of the pass gate are inverted signals of the input signals on the input terminal. The output 328 of the pass gate is connected to the pull-up device.

The differential amplifier 314 operates to provide a signal that is based on the voltage difference between a signal on the output node 306 and a reference voltage. As long as the voltage of the signal on the output node is less than the reference voltage, the differential amplifier outputs a "low" signal, which is proportional to the difference in voltage between the signal on the output node and the reference voltage. However, when the voltage of the signal on the output node is greater than the reference voltage, the differential amplifier outputs a high signal.

The pass gate 316 operates to pass the signal on the input 324 to the output 328 when the signal on the input 326 is high. When a low signal (i.e., a logical 0) is applied to the input 326 of the pass gate, the signal on the output 328 of the pass gate is high, regardless of the signal applied to the input 324 of the pass gate. Thus, a low signal on the input 326 of the pass gate functions as a disable signal for the pass gate. However, when a high signal (i.e., a logical 1) is applied to the input 326 of the pass gate, the signal on the output 328 of the pass gate depends the signal from the differential amplifier 314, which is applied to the input 324 of the pass gate. If the signal from the differential amplifier is low, then the signal on the output 328 of the pass gate is low. In contrast, if the signal from the differential amplifier is high, then the signal on the output of the pass gate is high.

In an exemplary configuration, the pass gate 316 includes a pair of transistors 332 and 334, which are shown in FIG. 3 as NMOS and PMOS transistors, respectively. However, the transistors 332 and 334 may be other type of transistors. The NMOS transistor 332 provides a conductive path from the input 324 of the pass gate to the output 328 of the pass gate. The gate of the NMOS transistor 332 is connected to the input 326 of the pass gate. Thus, the NMOS transistor 332 is controlled by the signals applied to the input 326 of the pass gate. The PMOS transistor 334 provides a conductive path from the output 328 of the pass gate to $V_{cc}$. The gate of the PMOS transistor 334 is connected to the input 326 of the pass gate. Thus, the PMOS transistor 334 is also controlled by the signals applied to the input 326 of the pass gate.

In operation, the NMOS transistor 332 of the pass gate 316 is activated when a high signal is applied to the input 326 of the pass gate, and consequently, the gate of the NMOS transistor 332. Since the input 326 of the pass gate receives an inverted signal of the input signal on the input terminal 310, the NMOS transistor 332 is activated when a low input signal is applied to the input terminal. The PMOS transistor 334 is activated by a low signal on its gate, which is connected to the input 326 of the pass gate via the inverter 330. Hence, the PMOS transistor 334 is activated by a high signal on the input terminal 310. With the activation of the NMOS transistor 332 and the deactivation of the PMOS transistor 334, the signal from the differential amplifier 314 is allowed to be transmitted through the pass gate. Thus, if the signal from the differential amplifier is a high signal, then the signal on the output 328 of the pass gate is also a high signal. Similarly, if the signal from the differential amplifier is a low signal, then the signal on the output of the pass gate is a low signal.

In contrast, the NMOS transistor 332 of the pass gate 316 is deactivated when a low signal is applied to the input 326 of the pass gate. Thus, the NMOS transistor 332 is deactivated when a high input signal is applied to the input terminal 310. The high input signal also activates the PMOS transistor 334 of the pass gate. With the deactivation of the NMOS transistor 332 and the activation of the PMOS transistor 334, the signal on the output 328 of the pass gate is high, regardless of the signal from the differential amplifier 314.

The output driver circuit 300 may include one or more optional electrostatic discharge (ESD) protection devices. In FIG. 3, the output driver circuit is shown with two ESD protection devices 336 and 338. The ESD protection device 336 includes four diodes, while the ESD protection device 338 includes a single diode. However, the ESD protection devices may include additional diodes or other electrical elements in known configurations. The ESD protection devices 336 and 338 operate to protect the components of the output driver circuit 300 from ESD.

The operation of the output driver circuit 300 is now described. When a high input signal (i.e., a logical signal of 1) is applied to the input terminal 310 of the output driver circuit, the pull-down NMOS transistor 304 is activated by the high input signal. In addition, the high input signal is inverted into a low signal by the inverter 330 and transmitted to the input 326 of the pass gate 316. Thus, the low signal is applied to the gate of the NMOS transistor 332 of the pass gate, which deactivates the NMOS transistor 332. Furthermore, the low signal on the pass gate input is applied to the gate of the PMOS transistor 334 of the pass gate, which activates the PMOS transistor 334. Consequently, the signal on the output 328 of the pass gate is high, which deactivates the pull-up PMOS transistor 302. Since the pass gate is "disabled" by the low signal on the input 326 of the pass gate, the signal from the differential amplifier 314 does not affect the signal on the output 328 of the pass gate. The deactivation of the pull-up PMOS transistor 302 isolates the output terminal 308 from Vcc. With the pull-down NMOS transistor 304 activated, the output terminal is connected to ground. Therefore, the output signal on the output terminal is low.

When a low input signal (i.e., a logical 0) is applied to the input terminal 310 of the output driver circuit 300, the pull-down NMOS transistor 304 is deactivated. In addition, the low input signal is inverted into a high signal by the inverter 330 and transmitted to the input 326 of the pass gate 316. Thus, the high signal is applied to the gate of the NMOS transistor 332 of the pass gate, which activates the NMOS transistor 332. Furthermore, the high signal on the input 326 of the pass gate is applied to the gate of the PMOS transistor 334 of the pass gate, which deactivates the PMOS transistor 334. Thus, the signal on the output 328 of the pass gate depends on the signal from the differential amplifier 314. The differential amplifier outputs a "low" signal as long as the voltage of the signal on the input 318, i.e., the signal on the output terminal 308, is less than the reference voltage. The signal from the differential amplifier 314 is applied to the input 324 of the pass gate 316. Since the NMOS transistor 332 is activated by the high signal on the gate of the NMOS transistor 332, the signal from the differential amplifier is transmitted through the NMOS transistor 332 to the pull-up PMOS transistor 302. Thus, the pull-up PMOS transistor is activated by a low signal from the differential amplifier, as long as the voltage of the output signal on the output terminal 308 remains below the reference voltage. However, if the voltage of the output signal becomes greater than the reference voltage, then the pull-up PMOS transistor is deactivated by a high signal from the differential amplifier. Therefore, the feedback loop 312 operates to float the output signal on the output terminal of the output driver circuit 300 after the output signal exceeds a predetermined voltage. When the voltage of the output terminal meets or exceeds the reference voltage, the pull-down PMOS transistor is deactivated, which floats the output terminal, allowing an external downstream device to pull the voltage up to a value compatible with the downstream device.

The pull-up effect of the PMOS transistor 302 allows the output driver circuit 300 to be compatible with input circuits of downstream external devices that meet SSTL specifications, such as SSTL-2 or SSTL-3. In addition, the output floating function of the feedback loop 312 allows the output driver circuit 300 to be compatible with input circuits of downstream external devices that meet open collector/drain specifications. Therefore, the output driver circuit 300 is complaint with both SSTL and open collector/drain specifications.

Figure 4:
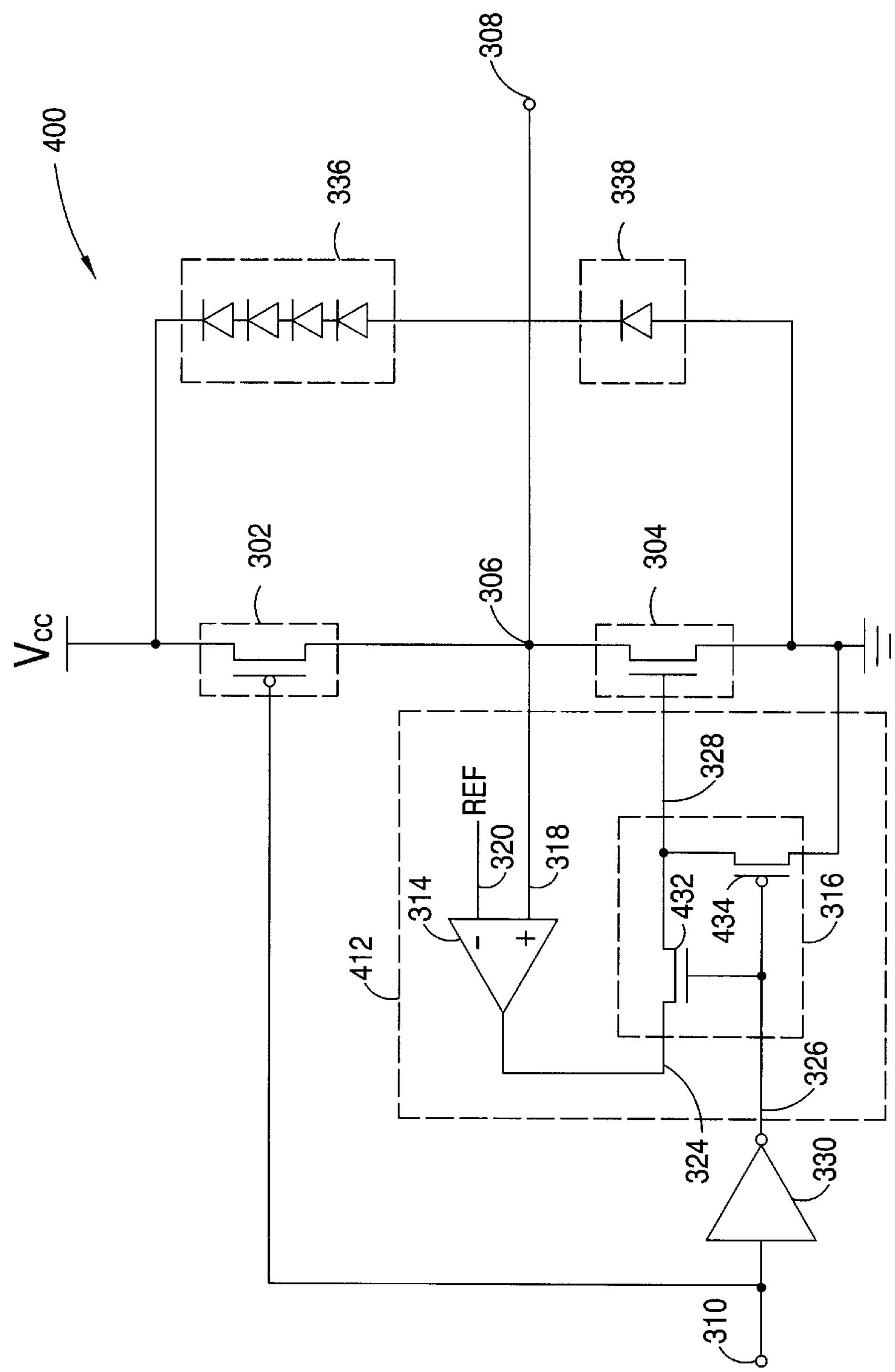
FIG. 4 is a schematic of the output driver circuit in accordance with a second embodiment of the present invention.

Turning now to FIG. 4, an output driver circuit 400 in accordance with a second embodiment of the invention is shown. Similar to the output driver circuit 300 of FIG. 3, the output driver circuit 400 of FIG. 4 is also designed to be compliant with both open collector/drain and stub series-terminated logic (SSTL) specifications. However, the output driver circuit 400 is designed to be compatible with input circuits of downstream external devices that are compliant with open collector/drain specifications having a resistor connected between the input of the downstream external devices and ground, instead of supply voltage.

The output driver circuit 400 of FIG. 4 includes the same components of the output driver circuit 300 of FIG. 3. Thus, the same reference numerals of FIG. 3 are used in FIG. 4 to identify identical components. The only significant difference between the output driver circuit 400 and the output driver circuit 300 is that the feedback loop 412 in the output driver circuit 400 is connected to the output node 306 and the pull-down device 304, whereas the feedback loop 312 in the output driver circuit 300 is connected to the output node 306 and the pull-up device 302. Thus, the feedback loop 412 in the output driver circuit 400 operates to control the pull-down device 304 in response to the signal on the output node. Consequently, the reference voltage provides a lower limit in the output driver circuit 400, whereas the reference voltage provides an upper limit in the output driver circuit 300. Other differences include a change in the polarity of the transistors in the pass gate 316 (PMOS vs. NMOS). Thus, in the output driver circuit 400, the pass gate 316 includes a PMOS transistor 432, which is connected between the input 324 and the pull-down device 304, and an NMOS transistor 434, which is connected between the output 328 of the pass gate and ground. In addition, the pull-up device 302 is directly connected to the input terminal 310.

The operation of the output driver circuit 400 of FIG. 4 is now described. When a low input signal (i.e., a logical signal of 0) is applied to the input terminal 310 of the output driver circuit 400, the low input signal is inverted by the inverter 330 and a high signal is transmitted to the input 326 of the pass gate 316, which deactivates the PMOS transistor 432 of the pass gate and activates the NMOS transistor 434 of the pass gate. Thus, the signal on the output 328 of the pass gate is the low, which deactivates the pull-down NMOS transistor 304. The low input signal is also applied to the gate of the pull-up PMOS transistor 302, which activates the pull-up PMOS transistor. Consequently, the output signal on the output terminal 308 of the output driver circuit 400 is high. That is, the output terminal is connected to $V_{cc}$.

When a high input signal (i.e., a logical signal of 1) is applied to the input terminal 310 of the output driver circuit 400, the high input signal is inverted by the inverter 330 and a low signal is transmitted to the input 326 of the pass gate 316, which activates the PMOS transistor 432 of the pass gate and deactivates the NMOS transistor 434 of the pass gate. Thus, the signal from the differential amplifier 314 is allowed to be transmitted to the pull-down NMOS transistor 304. Meanwhile, the high input signal is applied to the pull-up PMOS transistor 302, which deactivates the pull-up PMOS transistor. The differential amplifier generates a high signal as long as the voltage of the signal on the output terminal 308 is greater than the reference voltage. Thus, the high signal from the differential amplifier is applied to the pull-down NMOS transistor, which activates the pull-down NMOS transistor, until the voltage of the output terminal falls below the reference voltage. When the voltage of the output terminal falls below the reference voltage, the pull-down NMOS transistor is deactivated, which floats the output terminal, allowing an external downstream device to pull the voltage further down to a voltage compatible with the downstream device.

Figure 5:
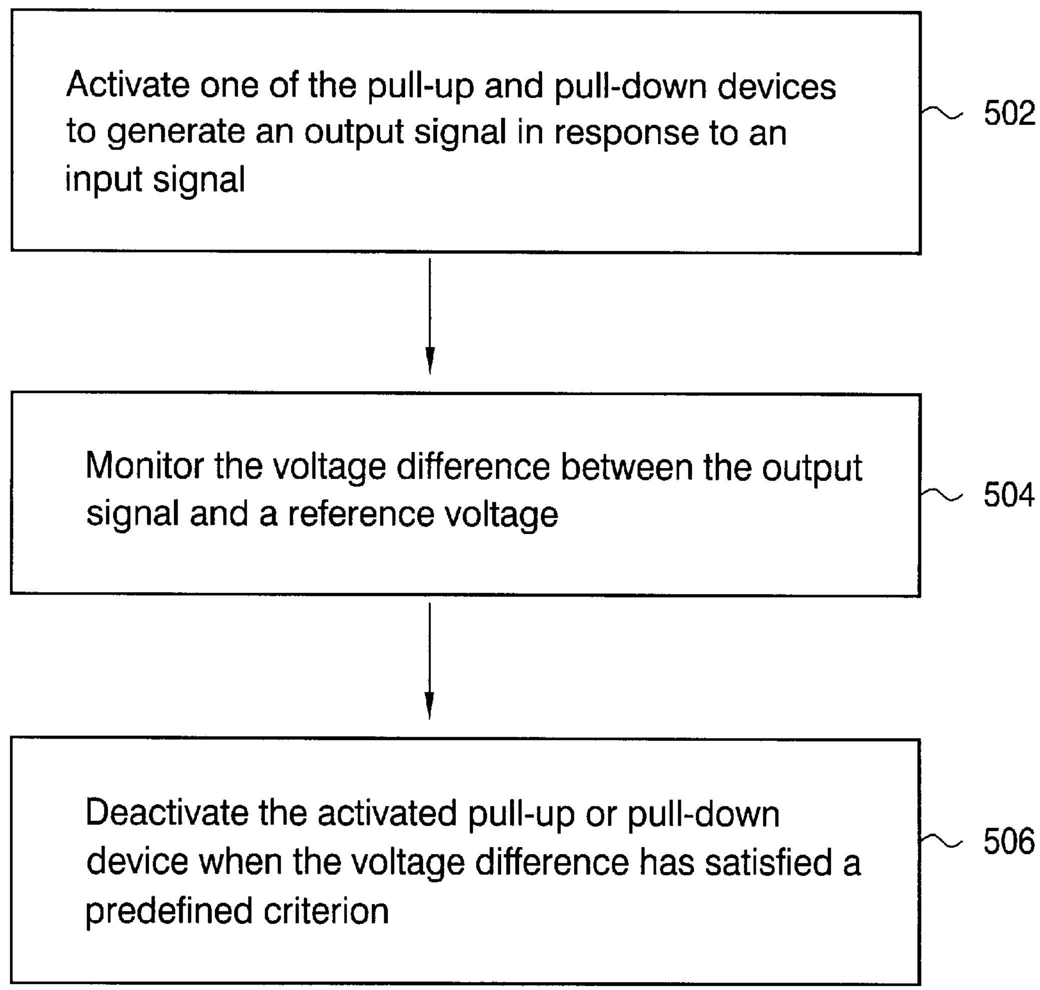
FIG. 5 is a flow diagram of a method of operating the output driver circuits of FIGS. 3 and 4 in accordance with the present invention.

A method of operating the output driver circuits 300 and 400 of FIGS. 3 and 4 is described with reference to a flow diagram of FIG. 5. At step 502, one of the pull-up and the pull-down devices 302 and 304 is activated in response to an input signal on the input terminal 310 to generate an output signal on the output terminal 308. The particular pull-up or pull-down device that is activated depends on the input signal. A high input signal activates the pull-down device 304, while a low input signal activates the pull-up device 302. Next, at step 504, the difference in voltage between the output signal on the output terminal and a reference voltage is monitored using the feedback loop 312 or 412. At step, 506, the activated pull-up or pull-down device is deactivated to float the output terminal when the voltage difference between the output signal on the output terminal and a reference voltage has satisfied a predefined criterion. For the output driver circuit 300, the predefined criterion is satisfied when the voltage on the output terminal has equaled or exceeded the reference voltage. For the output driver circuit 400, the predefined criterion is satisfied when the voltage on the output terminal has equaled or fallen below the reference voltage.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An output driver circuit comprising:

a pull-up device connected between a high voltage terminal and an output node;

a pull-down device connected between the output node and a low voltage terminal, the pull-down device and the pull-up device being configured to produce an output signal on the output node in response to an input signal; and a feedback loop connected to the output node and the pull-up device, the feedback loop being configured to selectively deactivate the pull-up device when the voltage of the output signal on the output node has exceeded a threshold voltage, the feedback loop including:

a differential amplifier having an output, a first input and a second input, the first input being connected to the output node to receive the output signal, the second input being configured to receive a reference voltage; and a pass gate connected to the output of the differential amplifier and the pull-up device, the pass gate being configured to transmit a signal from the differential amplifier to the pull-up device when the pass gate is enabled.

2. The output driver circuit of claim 1 wherein the pull-down device is connected to an input terminal such that the pull-down device is controlled by the input signal.

3. The output driver circuit of claim 1 wherein the pass gate of the feedback loop is configured to be enabled based on the state of the input signal.

4. The output driver circuit of claim 1 wherein at least one of the pull-up and pull-down devices is an active device selected from a group consisting of bipolar transistor, metal oxide semiconductor transistor and high electron mobility transistor.

5. A method of operating an output driver circuit comprising:

activating one of pull-up and pull-down devices of the output driver circuit to generate an output signal on an output node in response to an input signal, the pull-up device being connected between a high voltage terminal and the output node, the pull-down device being connected between the output node and a low voltage terminal; and deactivating one of the pull-up and pull-down devices that was activated to float the output node when the voltage of the output signal on the output node has satisfied a predefined criterion, including monitoring the output signal and a reference voltage to generate a differential signal and selectively passing the differential signal to one of the pull-up and pull-down devices for deactivation based on the input signal and the differential signal.

6. The method of claim 5 wherein the deactivating of one of the pull-up and pull-down devices includes deactivating the pull-up device when the voltage of the output signal on the output node has exceeded a threshold voltage, the threshold voltage being determined by the reference voltage.

7. The method of claim 5 wherein the deactivating of one of the pull-up and pull-down devices includes deactivating the pull-down device when the voltage of the output signal on the output node has fallen below a threshold voltage, the threshold voltage being determined by the reference voltage.

8. The method of claim 5 wherein the deactivating of one of the pull-up and pull-down devices includes enabling a pass gate based on the input signal and the differential signal to selectively pass the differential signal to one of the pull-up and pull-down devices.

9. An output driver circuit comprising:

a pull-up device connected between a high voltage node and an output node, a pull-down device connected between the output node and a low voltage node, the pull-down device having an input to receive an input signal, the pull-down device and the pull-up device being configured to produce an output signal on the output node in response to the input signal, and a feedback loop connected to the output node and the pull-up device, the feedback loop being configured to deactivate the pull-up device to float the output node when the voltage of the output signal on the output node has satisfied a predefined criterion, the feedback loop including:

a differential amplifier having first and second inputs and an output, the first input being connected to the output node to receive the output signal, the second input being configured to receive a reference voltage; and a pass gate connected to the output of the differential amplifier and the pull-up device, the pass gate being configured to transmit a signal from the differential amplifier to the pull-up device when the pass gate is enabled.

10. The output driver circuit of claim 9, wherein the feedback loop is configured to deactivate the pull-up device when the voltage of the output signal on the output node has exceeded a threshold voltage.

11. The output driver circuit of claim 9 wherein the pass gate of the feedback loop is configured to be selectively enabled based on the state of the input signal.

12. The output driver circuit of claim 9 wherein at least one of the pull-up and pull-down devices is an active device selected from a group consisting of bipolar transistor, metal oxide semiconductor transistor and high electron mobility transistor.

13. An output driver circuit comprising:

a pull-up device connected between a high voltage terminal and an output node;

a pull-down device connected between the output node and a low voltage terminal, the pull-down device and the pull-up device being configured to produce an output signal on the output node in response to an input signal; and a feedback loop connected to the output node and the pull-down device, the feedback loop being configured to selectively deactivate the pull-down device when the voltage of the output signal on the output node has fallen below a threshold voltage, the feedback loop including:

a differential amplifier having an output, a first input and a second input, the first input being connected to the output node to receive the output signal, the second input being configured to receive a reference voltage; and a pass gate connected to the output of the differential amplifier and the pull-down device, the pass gate being configured to transmit a signal from the differential amplifier to the pull-down device when the pass gate is enabled.

14. The output driver circuit of claim 13 wherein the pull-up device is connected to an input terminal such that the pull-up device is controlled by the input signal.

15. The output driver circuit of claim 13 wherein the pass gate of the feedback loop is configured to be selectively enabled based on the state of the input signal.

* * * * *